(12) United States Patent
Fujisawa (10) Patent No.: US 7,755,953 B2
(45) Date of Patent: *Jul. 13, 2010

(54) SEMICONDUCTOR MEMORY DEVICE WITH MINIMUM BURST LENGTH BIT TRANSFER IN PARALLEL TO AND FROM A FIFO BLOCK

(75) Inventor: Hiroki Fujisawa, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 177 days.

This patent is subject to a terminal disclaimer.

(21) Appl. No.: 11/895,695

(22) Filed: Aug. 27, 2007

(65) Prior Publication Data

US 2008/0049541 A1  Feb. 28, 2008

(30) Foreign Application Priority Data

Aug. 28, 2006 (JP) .............................. 2006-231211

(51) Int. Cl.
*G11C 7/10* (2006.01)
(52) U.S. Cl. .......................... 365/189.17; 365/189.05; 365/221
(58) Field of Classification Search ............ 365/189.05, 365/233.18, 189.17, 221
See application file for complete search history.

(56) References Cited

U.S. PATENT DOCUMENTS

| | | | |
|---|---|---|---|
| 6,771,552 B2 * | 8/2004 | Fujisawa .................... | 365/221 |
| 7,032,066 B2 * | 4/2006 | Miki et al. .................. | 711/104 |
| 7,426,144 B2 * | 9/2008 | Fujisawa ................. | 365/189.05 |
| 2001/0046176 A1 | 11/2001 | Sohn et al. | |
| 2003/0156481 A1 | 8/2003 | Fujisawa | |
| 2004/0228166 A1 * | 11/2004 | Braun et al. ................ | 365/154 |
| 2004/0246783 A1 | 12/2004 | Lee et al. | |
| 2005/0117403 A1 | 6/2005 | Fujisawa | |

FOREIGN PATENT DOCUMENTS

| | | |
|---|---|---|
| JP | 2000-82287 | 3/2000 |
| JP | 2001-23374 | 1/2001 |
| JP | 2001-332090 | 11/2001 |

(Continued)

OTHER PUBLICATIONS

DDR2 SDRAM Specification, May 2006, JEDEC Solid State Technology Association, JESD79-2C, §§ 2.2 & 2.4.*

(Continued)

*Primary Examiner*—Tuan T Nguyen
*Assistant Examiner*—R Lance Reidlinger
(74) *Attorney, Agent, or Firm*—Scully, Scott, Murphy & Presser, P.C.

(57) ABSTRACT

A semiconductor memory device includes an FIFO block connected to a data input/output terminal DQ, a time-division transfer circuit that inputs and outputs in parallel n-bit data inputted and outputted continuously via the data input/output terminal DQ, a data bus RWBS that performs a data transfer between the time-division transfer circuit and the FIFO block, and a mode register that sets a burst length. When a minimum burst length settable to the mode register is m (<n), the time-division transfer circuit performs the data transfer using the data bus in units of m bits irrespective of the burst length. Thereby, it becomes possible to set the burst length smaller than a prefetch number without performing a burst chop.

8 Claims, 6 Drawing Sheets

FOREIGN PATENT DOCUMENTS

| | | |
|---|---|---|
| JP | 2003-178583 | 6/2003 |
| JP | 2003-249077 | 9/2003 |
| JP | 2003-272382 | 9/2003 |
| JP | 2004-133961 | 4/2004 |
| JP | 2004-164769 | 6/2004 |
| JP | 2004-310918 | 11/2004 |
| JP | 2004-310989 | 11/2004 |
| JP | 2004-362756 | 12/2004 |
| JP | 2005-158165 | 6/2005 |
| JP | 2007-87436 | 4/2007 |

OTHER PUBLICATIONS

Fujisawa et al.,"An 8.1-ns Column-Access 1.6-Gb/s/pin DDR3 SDRAM With an 8:4 Multiplexed Data-Transfer Scheme," IEEE Journal of Solid-State Circuits, vol. 42, No. 1, Jan. 2007, pp. 201-209.*

* cited by examiner

SEMICONDUCTOR MEMORY DEVICE WITH MINIMUM BURST LENGTH BIT TRANSFER IN PARALLEL TO AND FROM A FIFO BLOCK

TECHNICAL FIELD

The present invention relates to a semiconductor memory device, and, more particularly to a semiconductor memory device capable of burst-outputting or burst-inputting data. The present invention also relates to a data processing system that includes such a semiconductor memory device.

BACKGROUND OF THE INVENTION

In DRAMs (Dynamic Random Access Memory) of recent years, a synchronous type that operates in synchronization with a clock signal has become mainly used. A frequency of the clock signal used for the synchronous DRAM increases year by year. However, in a DRAM core, a precharge operation, a sense operation, and the like are needed, and thus, it is not possible to increase the speed in proportion to a clock frequency. Accordingly, in the synchronous DRAM, a prefetch circuit is arranged between the DRAM core and input/output terminals to perform a parallel-serial conversion in the prefetch circuit. Thereby, an apparent high-speed operation is achieved (see Japanese Patent Applications Laid-open Nos. 2004-164769, 2004-310989, 2004-133961, 2003-272382, and 2004-310918).

For example, in a DDR2 synchronous DRAM, a 4-bit prefetch is performed in the prefetch circuit, and in a DDR3 synchronous DRAM, an 8-bit prefetch is performed in the prefetch circuit. Thereby, a high data transfer rate is achieved externally.

More specifically, in the DDR3 synchronous DRAM, 8-bit data is read at once from the DRAM core at the time of reading, and after the 8-bit data is temporarily stored in the prefetch circuit, the data is burst-outputted to outside. On the contrary, at the time of writing, the 8-bit data burst-inputted from outside is temporarily stored in the prefetch circuit, and thereafter, the 8-bit data is written into the DRAM core at once. To perform such operations, in the synchronous DRAM, a prefetch number is basically defined as a minimum burst length.

However, to realize a faster data transfer rate, it is inevitably necessary to increase the prefetch number. Thus, when the prefetch number is defined as the minimum burst length, it becomes impossible to be compatible with a conventional synchronous DRAM. In the case of the DDR3 synchronous DRAM, when the minimum burst length is set to 8, an operation at the burst length=4 which is possible in the DDR2 synchronous DRAM cannot be performed. As a result, the compatibility is lost.

To solve such a problem, so called a burst chop function has been proposed. The burst chop function is to make a designation in advance so that a burst operation stops in the middle at the time of issuing a read command or a write command. Accordingly, when a case in which the burst chop function is installed in the DDR3 synchronous DRAM is assumed, by the designation at the time of issuing the read command and the write command, it becomes possible to use a burst length=8 as a burst length=4. Thereby, even when the prefetch number increases, it becomes possible to be compatible with the past product (DDR2).

However, the burst chop function is, after all, to stop the burst operation in the middle. Thus, an input cycle of the command cannot be shortened. That is, in the DDR3 synchronous DRAM of which prefetch number is 8 bits, it is possible to receive the command by each 4 clock cycles (tCCD=4), while at the time of the burst chop, an input/output operation is completed in the first-half 2 clock cycles, and the last-half 2 clock cycles are a waiting time. That is, even when the burst length is shortened to 4 bits by using the burst chop function, the input cycle of the command is thereby not automatically shortened to 2 clock cycles (tCCD=2), and the input cycle of the command is still 4 clock cycles. Thus, there is a problem in that when the burst chop is performed, a data transfer efficiency is deteriorated.

As a method for solving such a problem, it can be possible to employ a method in which two sets of command decoders or address counters are arranged and the both components are operated with a delay of 2 clock cycles. However, in this method, the number of column address wirings and data buses are doubled, and thus, a chip area increases greatly. For example, when a chip in which data inputted and outputted simultaneously is 16 bits (×16 product) is assumed, if the prefetch number is 8, the number of data buses is 128 (=16×8) in a normal chip while two sets of 128 data buses, that is, as many as 256 data buses, are needed in the chip described above.

Further, in this method, when the burst length=8 is set, it is sufficient that only one of the circuits is operated. However, when the burst length=4 is set, it is necessary that the both circuits are operated. Thus, when the burst length=4 is set, a charge or discharge current of the data bus or the like is doubled as compared to a case of the burst length=8. As a result, there is a problem in that power consumption increases.

SUMMARY OF THE INVENTION

The present invention has been achieved in view of the above problems. Therefore, it is an object of the present invention to provide an improved semiconductor memory device in which a burst length can be set smaller than a prefetch number without performing a burst chop.

Another object of the present invention is to provide a semiconductor memory device in which a burst length can be set smaller than a prefetch number while an increase in circuit scale is inhibited.

Still another object of the present invention is to provide a semiconductor memory device in which a burst length can be set smaller than a prefetch number while an increase in power consumption is inhibited.

Still another object of the present invention is to provide an improved semiconductor memory device in which an input cycle of a command can be set smaller than a clock cycle number corresponding to a prefetch number.

The above and other objects of the present invention can be accomplished by a semiconductor memory device comprising: a data input/output terminal; an FIFO block for burst outputting a set of n-bit data from the data input/output terminal; a transfer circuit that transfers the set of n-bit data in parallel to the FIFO block via a data bus; and a mode register for setting a burst length, wherein the transfer circuit performs the data transfer operation using the data bus in units of m (<n) bits irrespective of the burst length where m is a minimum burst length settable to the mode register.

It is preferred that the semi conductor memory device according to the present invention further include memory cell arrays divided into a plurality of groups and a main amplifier that outputs n-bit data from each of the plurality of groups of the memory cell arrays. In this case, it is preferred that the transfer circuit select m-bit data by each group out of the n-bit data outputted from the main amplifier, and supply the selected m-bit data via the data bus to the FIFO block.

When the burst length set to the mode register is n, the transfer circuit sequentially supplies via the data bus to the FIFO block the n-bit data read from the memory cell array belonging to the same group by each m bits. On the other hand, when the burst length set to the mode register is m, the transfer circuit sequentially supplies via the data bus to the FIFO block the m-bit data read from the memory cell array belonging to a different group.

According to the present invention, the data transfer using the data bus is performed in units of m bits, which is the minimum burst length, irrespective of the burst length set to the mode register. Thus, it becomes possible to set the burst length smaller than a prefetch number without performing a burst chop. Further, a data transfer cycle using the data bus is constant irrespective of an input cycle of the command. Thus, it becomes possible to inhibit an increase in circuit scale or an increase in power consumption.

BRIEF DESCRIPTION OF THE DRAWINGS

The above and other objects, features and advantages of this invention will become more apparent by reference to the following detailed description of the invention taken in conjunction with the accompanying drawings, wherein.

DETAILED DESCRIPTION OF THE EMBODIMENTS

Preferred embodiments of the present invention will now be explained in detail with reference to the drawings.

Figure 1:
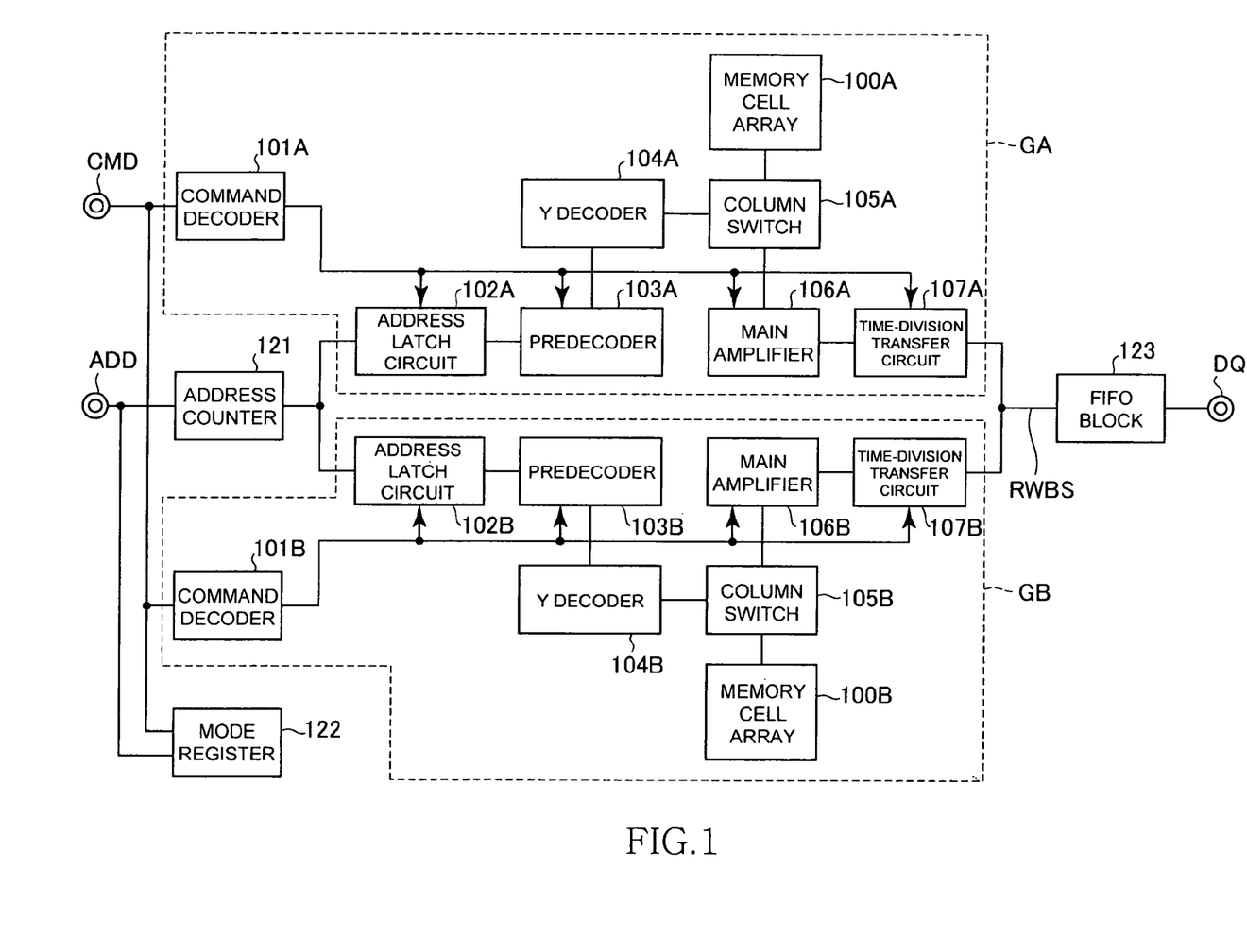
FIG. 1 is a block diagram showing a configuration of relevant parts of a semiconductor memory device according to a preferred embodiment of the present invention.

FIG. 1 is a block diagram showing a configuration of relevant parts of a semiconductor memory device according to a preferred embodiment of the present invention. In FIG. 1, a column-system circuit and a data-system circuit only, which are characteristic portions of the semiconductor memory device according to the embodiment, are shown, and a row-system circuit and the like are omitted.

The semiconductor memory device is a DDR3 synchronous DRAM, and a prefetch number is 8 bits. Regarding a burst length (BL), it is possible to select at least BL=4 and BL=8, and a minimum burst length is BL=4.

As shown in FIG. 1, most of the circuit elements of the semiconductor memory device are divided into two groups, i.e., a group GA and a group GB. However, an address counter 121, a mode register 122, and an FIFO block 123 are not divided, and these components are arranged commonly to the two groups.

More specifically, a command supplied via a command terminal CMD is supplied commonly to command decoders 101A and 101B. On the other hand, a column address supplied via an address terminal ADD is supplied to the address counter 121. A required number N of address counters 121 is calculated by:

$$N=1+\{AL+CWL+(BL/2)+2\}/tCCD,$$

where AL is an additive latency, CWL is a CAS write latency, BL is a burst length, and tCCD is a minimum input cycle of a command.

As an example, when

AL=10

CWL=8

BL=4, and tCCD=2 are established,

N=12 is given, that is, 12 address counters 121 are needed.

The column address, which is output of the address counter 121, is supplied commonly to the groups GA and GB. Thus, one set of column address wirings can be sufficient. The column address is latched to one of address latch circuits 102A and 102B by control of the command decoders 101A and 101B. Thereby, the column address is effective to one of the groups GA and GB.

The column address supplied to the group GA is supplied to the address latch circuit 102A, a predecoder 103A, a Y decoder 104A to control a column switch 105A. The column switch 105A is supplied with data read from a memory cell array 10A, and the selected data is supplied to a main amplifier 106A by control of the Y decoder 104A. Output of the main amplifier 106A is supplied to a time-division transfer circuit 107A. The same is true of the group GB.

Figure 2:
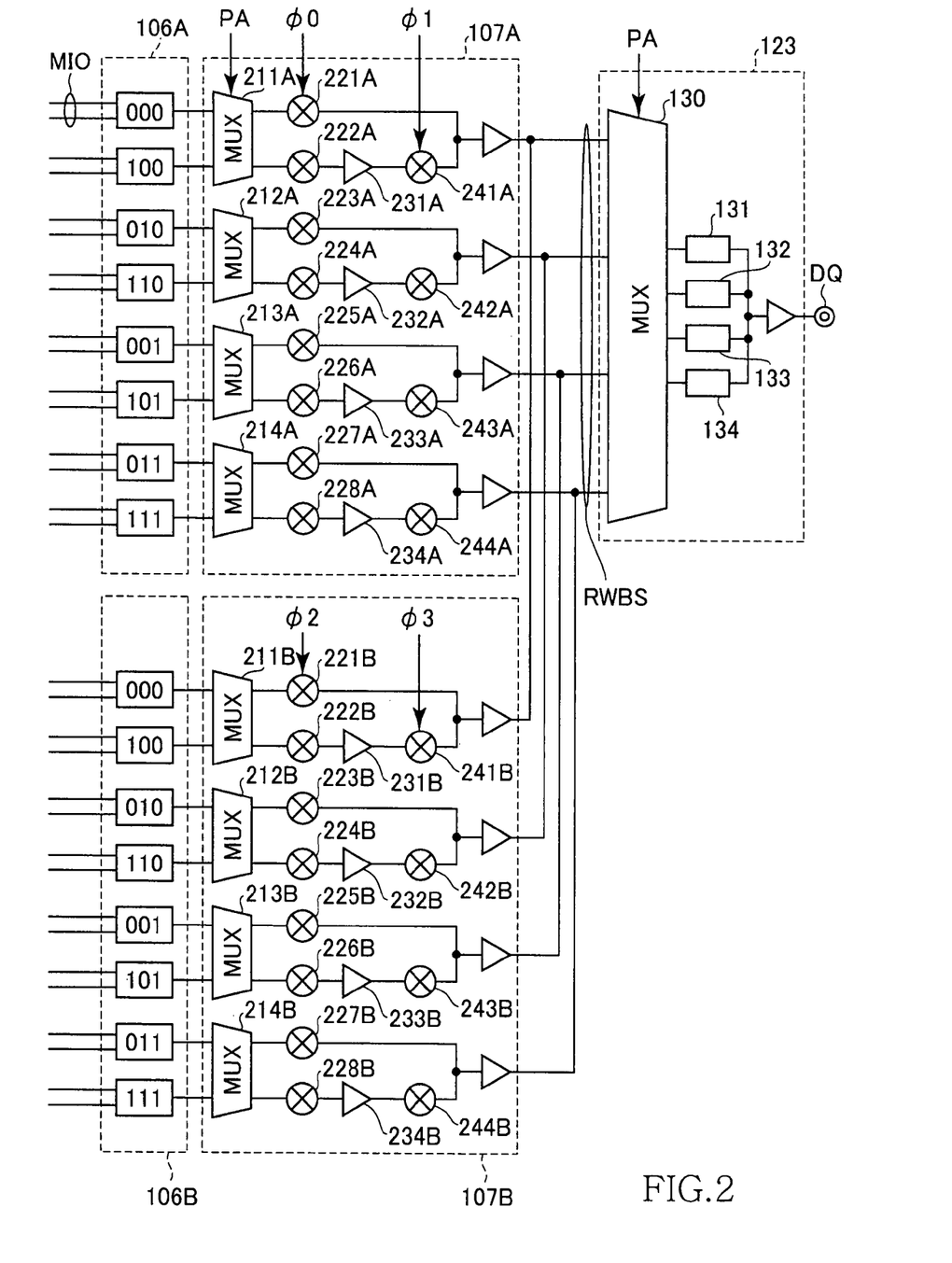
FIG. 2 is a circuit diagram showing in more detail a circuit from the main amplifiers to a data input/output terminal shown in FIG. 1.

FIG. 2 is a circuit diagram showing in more detail a circuit from the main amplifiers 106A and 106B to a data input/output terminal DQ. The circuit shown in FIG. 2 is a portion relating to one data input/output terminal DQ, and accordingly, the same circuits of a number that is equal to the number of bits simultaneously inputted and outputted are needed. For example, in a case of a chip (×16 product) in which data simultaneously inputted and outputted is 16 bits, 16 circuits shown in FIG. 2 are needed.

As shown in FIG. 2, from the main amplifiers 106A and 106B, 8-bit data, which is the same number as a prefetch number, are outputted, respectively. In the column address of these data, high-order bits are common, and low-order 3 bits only are different. 3-bit values shown within the main amplifiers 106A and 106B indicate the low-order 3 bits of the column address. The main amplifiers 106A and 106B have a function for converting a complementary signal into a single signal.

Outputs of the main amplifiers 106A and 106B are supplied to the time-division transfer circuits 107A and 107B, respectively. The time-division transfer circuit 107A includes four multiplexers 211A to 214A, eight switches 221A to 228A, four buffers 231A to 234A, and four switches 241A to 244A. The time-division transfer circuit 107B has the same circuit configuration.

The multiplexers 211A to 214A are circuits that switch an association relationship between 2-bit data supplied from the main amplifier 106A and the switches 221A to 228A. The switching is controlled by a prefetch address PA. For example, in the case of the multiplexer 211A, data of which low-order 3-bits are "000" is outputted to the switch 221A or the switch 222A, and data of which low-order 3-bits are "100" is outputted to the switch 222A or the switch 221A. The same is true of the multiplexers 211B to 214B included in the time-division transfer circuit 107B.

As shown in FIG. 2, while outputs of the switches 221A, 223A, 225A, and 227A are directly supplied to a data bus RWBS, outputs of the switches 222A, 224A, 226A, and 228A are supplied via the switches 231A to 234A and 241A to 244A, respectively, to the data bus RWBS. The switches 221A to 228A are circuits rendered conducting in response to a control signal φ0, and the switches 241A to 244A are circuits rendered conducting in response to a control signal φ1. Accordingly, based on timings of the control signals φ0 and φ1, it is possible to supply the 8-bit data supplied from the main amplifier 106A to the data bus RWBS in a time-division manner by each 4 bits. The above-described configuration and operation are true of those in the time-division transfer circuit 107B.

The data bus RWBS is arranged commonly to the time-division transfer circuits 107A and 107B. Thus, the number of the data buses RWBS is 4. Accordingly, in a case of the ×16 product, the number of the data buses RWBS is 64 (=4×16). Thus, the number is reduced as compared to a conventional case. Since a semiconductor memory device of a type in which a burst chop is performed needs 128 (=8×16) data buses RWBS, the number is reduced to half. Further, a semiconductor memory device of a type in which two sets of command decoders or address counters are simply arranged needs 256 (=8×16×2) data buses RWBS, as described above. Thus, the number is reduced to ¼.

As shown in FIG. 2, the data buses RWBS are connected to the FIFO block 123. The FIFO block 123 includes a multiplexer 130 and four FIFO circuits 131 to 134. The multiplexer 130 is a circuit that switches an association relationship between the 4-bit data supplied via the data bus RWBS and the FIFO circuits 131 to 134. The switching is controlled by the prefetch address PA.

The FIFO circuits 131 to 134 can each hold read data of (CL+BL/2)/2, where CL is a CAS latency. Accordingly, when BL=8 is established, at least 2-bit read data can be held. Thereby, the FIFO circuits 131 to 134 become capable of holding 8-bit read data which is the same as the prefetch number. At the time of outputting data, the read data stored in the FIFO circuits 131 to 134 are outputted in this order in synchronization with an external clock signal (CK).

Figure 3:
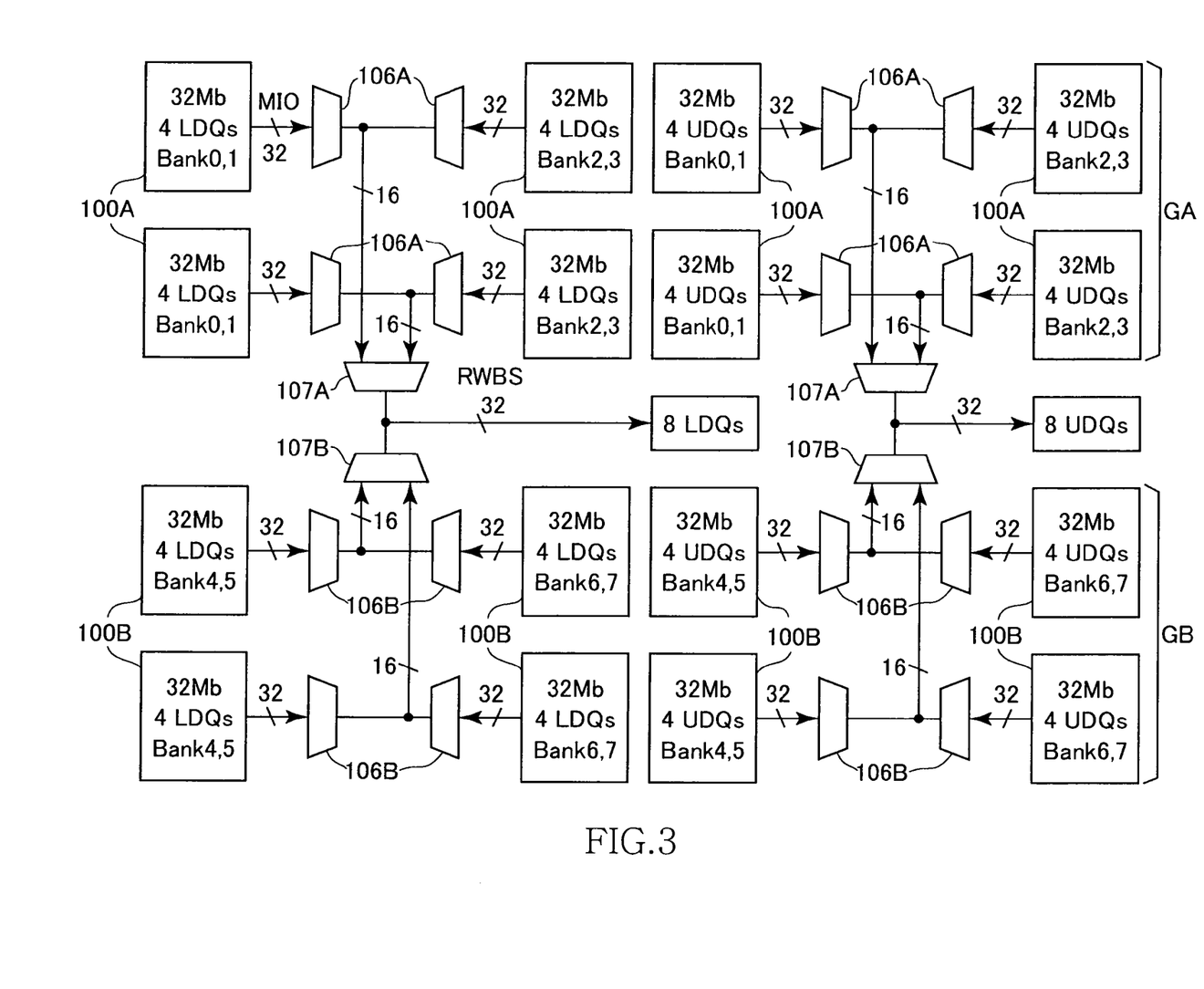
FIG. 3 is a schematic layout chart of the semiconductor memory device according to the preferred embodiment of the present invention.

FIG. 3 is a schematic layout chart of the semiconductor memory device according to the embodiment. This example shows a 512M-bit memory of which prefetch number is 8 bits and input/output bit number is 16 bits (×16 product).

As shown in FIG. 3, in this example, the memory cell array is divided into 8 banks (a bank 0 to a bank 7), and out of these banks, the banks 0 to 3 belong to the group GA and the banks 4 to 7 belong to the group GB. Each of the banks 0 to 7 is divided into four memory mats, and 16-bit data simultaneously inputted and outputted are allotted to the four memory mats by each 4 bits. In the semiconductor memory device, the prefetch number is 8 bits, and thus, 32-bit (=4×8) data is simultaneously inputted and outputted to/from each memory mat.

Subsequently, an operation of the semiconductor memory device is described.

Figure 4:
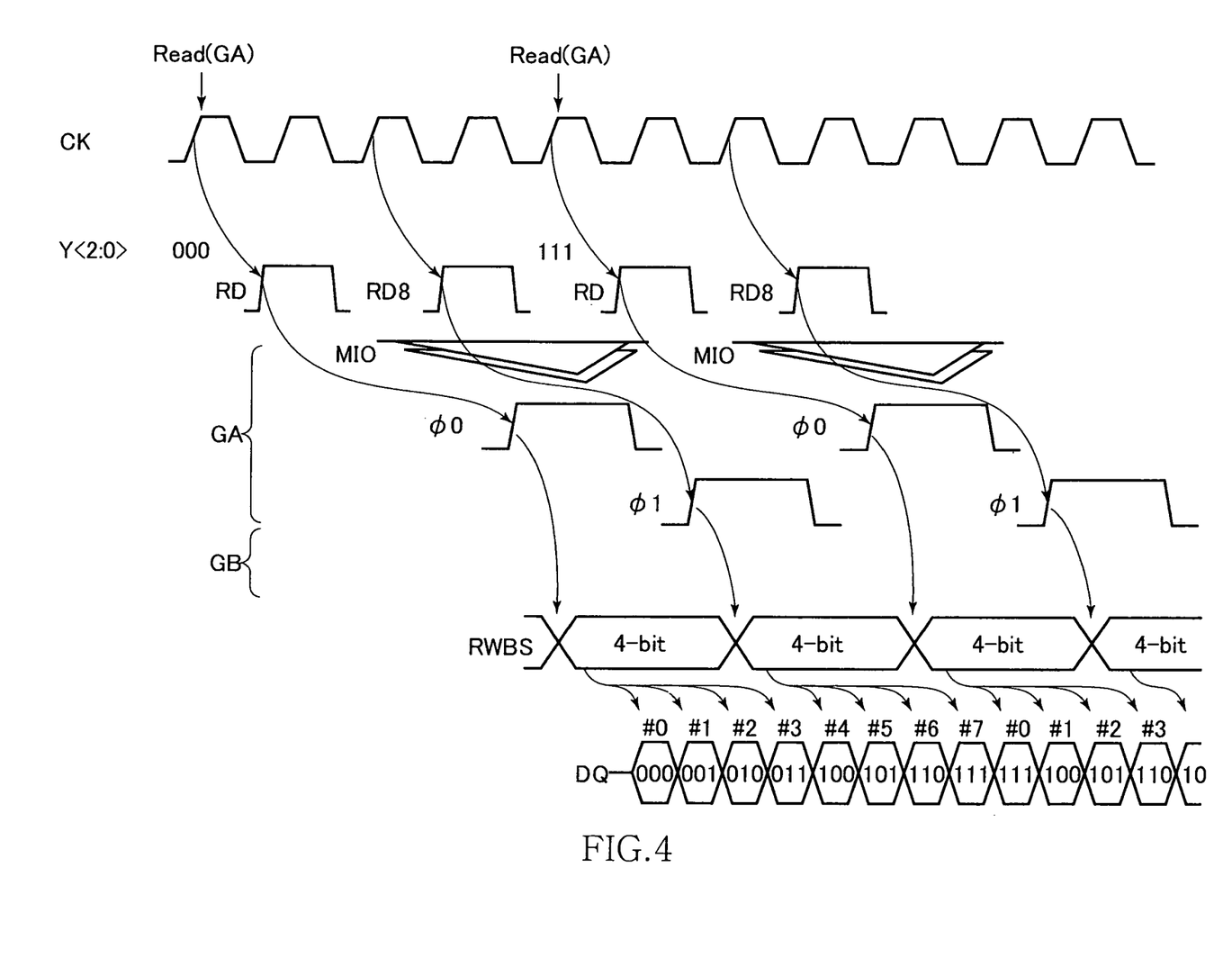
FIG. 4 is a timing chart showing an operation when the burst length is set to 8 bits (BL=8)

FIG. 4 is a timing chart showing an operation when the burst length is set to 8 bits (BL=8). Setting of the burst length is performed by issuing a command of a mode register set, and thereafter, setting to the mode register 122 shown in FIG. 1 a mode signal indicating the burst length.

As shown in FIG. 4, when BL=8 is set, the input cycle of the command (a read command, in the example shown in FIG. 4) is 4 clock cycles. That is, it is possible to receive the command by each 4 clock cycles (tCCD=4).

Firstly, when a first read command is issued, the command decoder 101A generates an internal command RD, and in response thereto, a read operation is begun within the group GA. When BL=8 is set, the command decoder 101A generates the internal command RD, and thereafter, generates an internal command RD8 with a delay of 2 clock cycles.

Data of 8 bits per DQ read in response to the internal command RD is amplified by the main amplifier 106A, and supplied to the time-division transfer circuit 107A. Thereafter, the control signal φ0 that responds to the internal command RD is rendered active, and further, the control signal φ1 that responds to the internal command RD8 is rendered active with a delay of 2 clock cycles. When the control signal φ0 is rendered active, 4 bits, out of read 8 bits, are supplied to the data bus RWBS, and these 4-bit data are transferred to the FIFO block 123.

These 4-bit read data are respectively stored in the FIFO circuits 131 to 134, and are burst-outputted in synchronization with the external clock signal CK. While such burst output is being performed, the control signal φ1 is rendered active this time, and the remaining 4 bits are supplied to the data bus RWBS. Thereafter, subsequent to the burst output of the first-half 4 bits, the last-half 4 bits are burst-outputted. Thereby, BL=8 is achieved.

Subsequently, when a second read command is issued with a delay of 4 clock cycles from the issuing of the first read command, the operation similar to that described above is performed.

In the example shown in FIG. 4, a case where a burst type is a sequential mode is shown. The low-order 3 bits of the column address that corresponds to the first read command is "000", and the low-order 3 bits of the column address that corresponds to the second read command is "111". Thereby, in the burst output that corresponds to the first read command, data having the column address of which low-order 3 bits are "000" is firstly outputted, and in the burst output that corresponds to the second read command, data having the column address of which low-order 3 bits are "111" is firstly outputted. Such control can be possible by controlling the multiplexers 211A to 214A, 211B to 214B, and 130, based on the prefetch address PA shown in FIG. 2.

Thus, when BL=8 is set, only one of the groups GA and GB is operated, and the other group is not operated. The data transfer using the data bus RWBS is performed in units of 4 bits. Thus, an operation frequency of the data bus RWBS is doubled as compared to the conventional case. However, due to the decrease in number of data buses RWBS, it becomes possible to arrange a shield wiring between the adjacent data buses. Thus, nearly no signal quality deterioration is caused due to the doubled operation frequency.

That is, when the shield wirings are interposed, respectively, among 64 data buses RWBS, the number of wirings is 128, similar to the conventional case where the burst chop is performed. However, the shield wiring can be not a signal line but a power supply wiring, for example. Thus, it is possible to use a wiring thinner than the data bus RWBS. As a result, it becomes possible to make a wiring width of the data bus RWBS thick.

More specifically, while L/S (line and space) of the data bus RWBS in the conventional case where the burst chop is performed is 1.0/1.0 μm, the L/S of the data bus RWBS can be expanded to 1.2/1.2 μm in the semiconductor memory device according to the embodiment. As a result, a signal delay is not only decreased, but coupling noise between the adjacent wirings can also be decreased. Thus, there is nearly no signal quality deterioration caused due to the increase in operation frequency.

Figure 5:
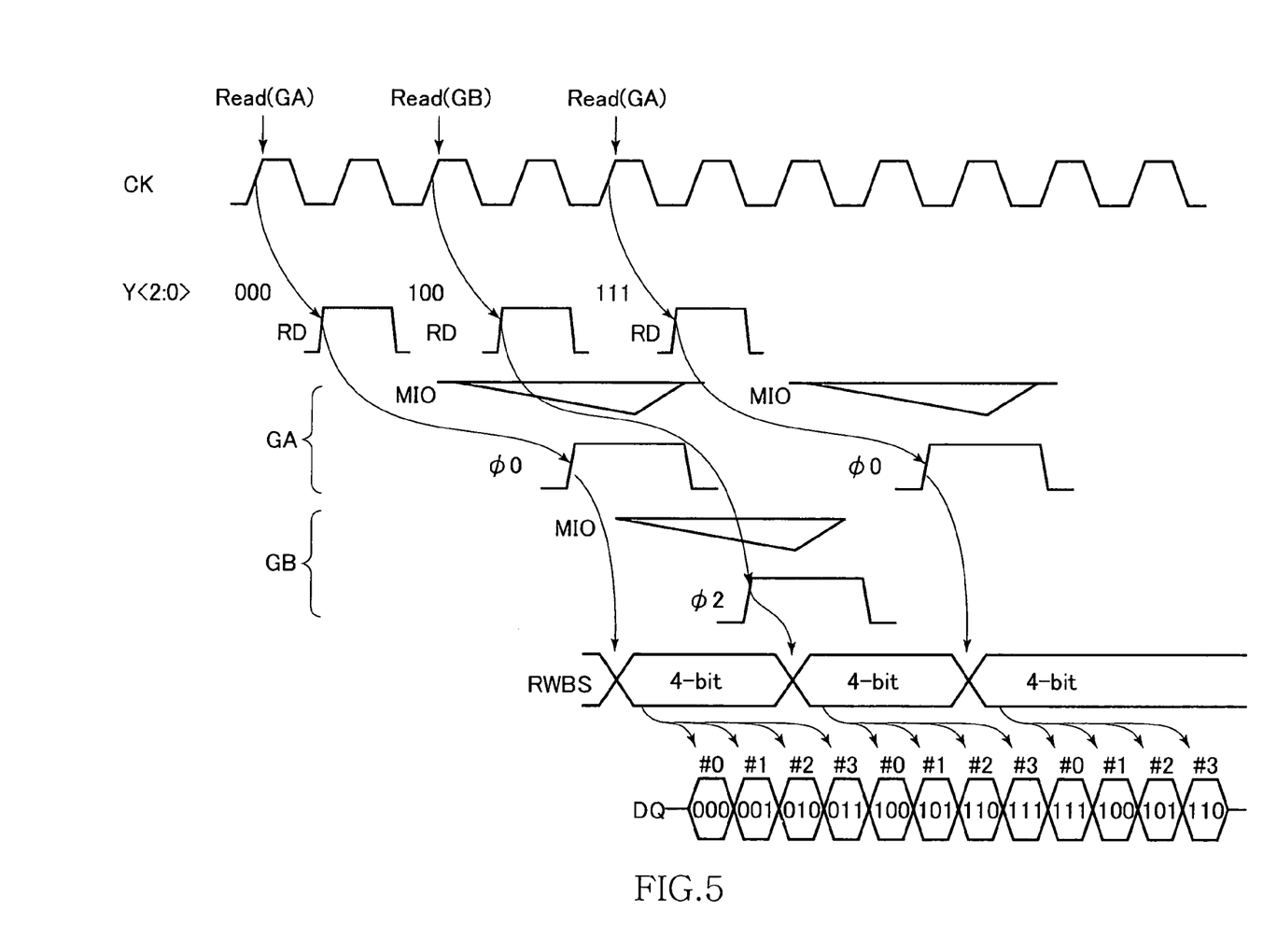
FIG. 5 is a timing chart showing an operation when the burst length is set to 4 bits (BL=4)

FIG. 5 is a timing chart showing an operation when the burst length is set to 4 bits (BL=4).

As shown in FIG. 5, when BL=4 is set, the input cycle of the command (the read command, in the example shown in FIG. 5) is 2 clock cycles. That is, it is possible to receive the command by each 2 clock cycles (tCCD=2).

Firstly, when the first read command is issued, the command decoder 101A generates the internal command RD, and in response thereto, the read operation is performed within the group GA. When BL=4 is set, the internal command RD8 is not generated.

The data of 8 bits per DQ read in response to the internal command RD is amplified by the main amplifier 106A, and supplied to the time-division transfer circuit 107A. Thereafter, when the control signal φ0 is rendered active in response to the internal command RD, 4 bits, out of read 8 bits, are supplied to the data bus RWBS, and the 4-bit data are transferred to the FIFO block 123. On the other hand, when BL=4 is set, the control signal φ1 is not rendered active, and thus, the remaining 4 bits are not supplied to the data bus RWBS.

Subsequently, when the second read command is issued with a delay of 2 clock cycles from the issuing of the first read command, the command decoder 101B generates the internal command RD this time, and in response thereto, the read operation is performed within the group GB. The data of 8 bits per DQ thereby read is amplified by the main amplifier 106B, and is supplied to the time-division transfer circuit 107B. Thereafter, when the control signal φ2 is rendered active in response to the internal command RD, 4 bits, out of read 8 bits, are supplied to the data bus RWBS, and the 4-bit data are transferred to the FIFO block 123. Again, a control signal φ3 is not rendered active, and thus, the remaining 4 bits are not supplied to the data bus RWBS.

Subsequently in a similar manner, the groups GA and GB are alternately operated. Thus, BL=4 can be achieved. In this manner, in the semiconductor memory device according to the embodiment, in the operation at BL=4, the data transfer using the data bus RWBS is also performed in units of 4 bits.

In the example shown in FIG. 5, a case where the burst type is a sequential mode is shown. The low-order 3 bits of the column address corresponding to the first read command is "000", the low-order 3 bits of the column address corresponding to the second read command is "100", and the low-order 3 bits of the column address corresponding to the third read command is "111". Thus, in the burst output corresponding to the first read command, the data having the column address of which low-order 3 bits are "000" is firstly outputted, and the data of which low-order 3 bits are "100" to "111" are not outputted. Likewise, in the burst output corresponding to the second or third read command, the data having the column address of which low-order 3 bits are "100" or "111" is firstly outputted, and the data of which low-order 3 bits are "000" to "011" are not outputted.

As described above, in the semiconductor memory device according to the embodiment, the data transfer using the data bus RWBS is performed in units of 4 bits, which is the minimum burst length, irrespective of the burst length. Thus, a need of performing the burst chop can be eliminated. Further, the data transfer cycle using the data bus is constant irrespective of the input cycle of the command. Thus, it becomes possible to inhibit an increase in circuit scale or an increase in power consumption.

According to the present invention, the data transfer using the data bus is performed in units of m bits, which is the minimum burst length, irrespective of the burst length set to the mode register. Thus, it becomes possible to set the burst length smaller than a prefetch number without performing a burst chop. Further, a data transfer cycle using the data bus is constant irrespective of an input cycle of the command. Thus, it becomes possible to inhibit an increase in circuit scale or an increase in power consumption.

The present invention can preferably apply to the semiconductor memory device, especially a DRAM.

Figure 6:
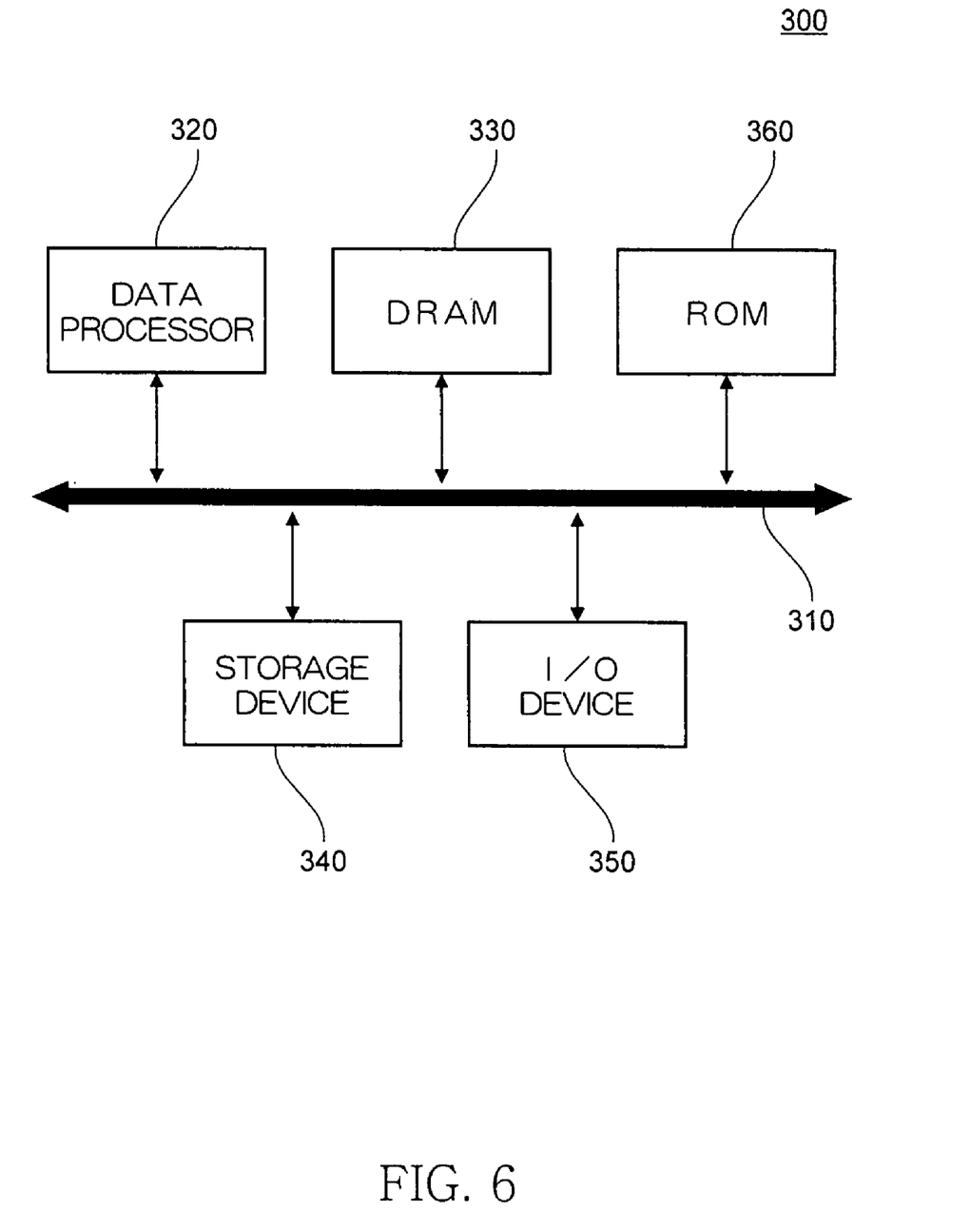
FIG. 6 is a block diagram showing a data processing system using the DRAM that the present invention is applied.

FIG. 6 is a block diagram showing a data processing system using the DRAM that the present invention is applied.

The data processing system 300 shown in FIG. 6 includes a data processor 320 and a DRAM 330 that the present invention is applied are connected to each other via a system bus 310. The data processor 320 can be selected from at least a microprocessor (MPU) and a digital signal processor (DSP). In FIG. 6, although the data processor 320 and the DRAM 330 are connected via the system bus 310 in order to simplify the diagram, they can be connected via not the system bus 310 but a local bus.

Further, in FIG. 6, although only one set of system bus 310 is employed in the data processing system 300 in order to simplify the diagram, a serial bus or a parallel bus connected to the system bus 310 via connectors can be provided. As shown in FIG. 6, a storage device 340, an I/O device 350, and a ROM 360 are connected to the system bus 310. However, they are not essential element for the data processing system 300.

The storage device 340 can be selected from at least a hard disk drive, an optical disk drive, and flash memory device. The I/O device 350 can be selected from a display device such as a liquid crystal display (LCD) and an input device such as a key board or a mouse. The I/O device 350 can consists of either input or output device. Further, although each one element is provided as shown in FIG. 6, two or more same elements can be provided in the data processing system.

The present invention is in no way limited to the aforementioned embodiments, but rather various modifications are possible within the scope of the invention as recited in the claims, and naturally these modifications are included within the scope of the invention.

What is claimed is:

1. A semiconductor memory device comprising:
   a memory cell array;
   an FIFO block that latches and outputs m-bit data via a data input/output terminal in a burst manner by performing a parallel serial conversion;
   a transfer circuit that transfers n-bit data in parallel to/from the memory cell array, the n-bit data being burst received from the data input/output terminal or to be burst outputted via the data input/output terminal;
   m data buses that are used to perform a data transfer operation between the transfer circuit and the FIFO block; and
   a mode register for setting a burst length;
   wherein the transfer circuit performs the data transfer operation using the data buses in units of m bits irrespective of the burst length where m is a minimum burst length settable in the mode register, the minimum burst length m is less than a minimum value of a prefetch number n, wherein
   the memory cell array is divided into a plurality of groups;
   the semiconductor memory device further comprises a main amplifier that outputs the n-bit data from each of the plurality of groups of the memory cell arrays;
   the transfer circuit selects m-bit data by each group out of the n-bit data outputted from the main amplifier; and
   the transfer circuit sequentially supplies via the data buses to the FIFO block the n-bit data read from the memory cell array belonging to a first group by each m bits, or sequentially supplies via the data buses to the FIFO block the m-bit data read from the memory cell array belonging to the first group and the m-bit data read from the memory cell array belonging to a second group, based on a content of the mode register.

2. The semiconductor memory device as claimed in claim 1, wherein the transfer circuit sequentially supplies via the data bus to the FIFO block the n-bit data read from the memory cell array belonging to the first group by each m bits when the burst length set to the mode register is n.

3. The semiconductor memory device as claimed in claim 1, wherein the transfer circuit sequentially supplies via the data bus to the FIFO block the m-bit data read from the memory cell array belonging to the first group and the m-bit data read from the memory cell array belonging to the second group when the burst length set to the mode register is m.

4. A semiconductor memory device comprising:
an FIFO block that latches a set of m-bit data in parallel, converts the set of m-bit data from parallel into serial, and outputs the set of m-bit data in serial from a data input/output terminal;
a memory array divided into a plurality of groups including at least first and second groups;
a transfer circuit that transfers a set of n-bit data burst inputted via or burst outputted from the data/output terminal between the FIFO block and the memory array in parallel, where n is larger than m;
m data buses that are used to perform a data transfer operation between the transfer circuit and the FIFO block;
a mode register in which a burst length is set; and
a main amplifier that outputs the set of n-bit data from each group of the memory array, wherein
a minimum burst length settable in the mode register is m and n is m times 2 to the $k^{th}$ power,
the transfer circuit performs the data transfer operation using the data buses in units of m bits irrespective of the burst length,
the transfer circuit selects m-bit data by each group out of the n-bit data outputted from the main amplifier, the transfer circuit sequentially supplies via the data buses to the FIFO block the n-bit data belonging to the first group by each m bits, or sequentially supplies via the data buses to the FIFO block each of the m-bit data which is chosen from the n-bit data belonging to the first and second groups, based on a content of the mode register, and wherein
the transfer circuit sequentially supplies 2 to $k^{th}$ power times, via the data buses to the FIFO block, the n-bit data belonging to the first group by each m bits when the burst length set in the mode register is n, the $k^{th}$ is an integer greater than or equal to one, and
the transfer circuit sequentially supplies, via the data buses to the FIFO block, each of the m-bit data belonging to the first and second groups when the burst length set in the mode register is m.

5. The semiconductor memory device as claimed in claim 4, wherein the data transfer operation using the data buses is performed in units of m bits in response to a read command.

6. The semiconductor memory device as claimed in claim 4, further comprising a shield wiring located between adjacent data buses.

7. The semiconductor memory device as claimed in claim 6, wherein a line and space of the shield wiring is smaller than that of the data buses.

8. The semiconductor memory device as claimed in claim 6, wherein the shield wiring is a power supply wiring.

* * * * *